(12) United States Patent
Scott et al.

(10) Patent No.: US 7,724,098 B2
(45) Date of Patent: May 25, 2010

(54) GYROMAGNETIC PRECESSION OSCILLATOR

(75) Inventors: Michael C. Scott, Rockwall, TX (US); Steve E. Calico, Fort Worth, TX (US); David S. Hidinger, Colleyville, TX (US); Chris E. Williams, Mansfield, TX (US)

(73) Assignee: Lockheed Martin Corporation, Bethesda, MA (US)

( * ) Notice: Subject to any disclaimer, the term of this patent is extended or adjusted under 35 U.S.C. 154(b) by 0 days.

(21) Appl. No.: 12/192,311

(22) Filed: Aug. 15, 2008

(65) Prior Publication Data

US 2009/0051451 A1    Feb. 26, 2009

Related U.S. Application Data

(60) Provisional application No. 60/957,574, filed on Aug. 23, 2007.

(51) Int. Cl.
*H03B 5/18* (2006.01)
*H01P 7/04* (2006.01)

(52) U.S. Cl. ............... 331/101; 331/96; 331/177 R; 331/86; 333/222; 342/82

(58) Field of Classification Search ............ 331/86, 331/90, 96, 97, 101, 177 R, 79, 81; 333/1.1, 333/24.1, 219.2, 222, 227, 219, 218; 342/202, 342/82, 175

See application file for complete search history.

(56) References Cited

U.S. PATENT DOCUMENTS 7,498,978 B2 *    3/2009   Seddon et al. ............ 342/202

OTHER PUBLICATIONS

Furuya et al, "Simulation of Nonlinear Coaxial Line Using Ferrite Beads", Nov. 2002, Japanese Journal of Applied Physics, vol. 41, pp. 6536-6540.*

* cited by examiner

*Primary Examiner*—Robert Pascal
*Assistant Examiner*—Ryan Johnson
(74) *Attorney, Agent, or Firm*—Williams Morgan & Amerson, P.C.

(57) ABSTRACT

The present invention is, in one aspect, a radio frequency source, comprising a gyromagnetic precession oscillator. In a second aspect, the gyromagnetic precession oscillator comprises a closed, non-magnetic, cylindrical outer conductor defining a cavity therein; an axial field solenoid wound about the outer conductor; a non-magnetic, cylindrical inner conductor disposed within the cavity and coaxially aligned with the outer conductor; a plurality of cylindrical ferrite precessors, each defining a respective bore through which the inner conductor runs; a plurality of dividers disposed within and defining a resonant chamber in the cavity; and a dielectric material filling the cavity. In a third aspect, the radio frequency source is actively tunable. In a fourth aspect, the radio frequency source that is tunable pulse-to-pulse.

12 Claims, 2 Drawing Sheets

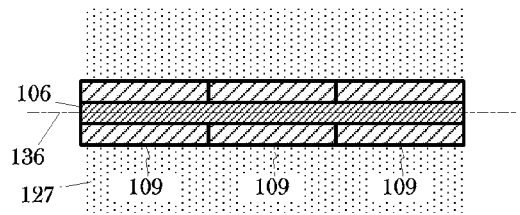
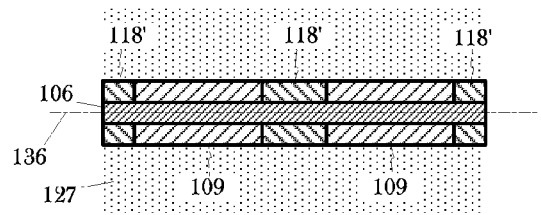
FIG. 2A          FIG. 2B
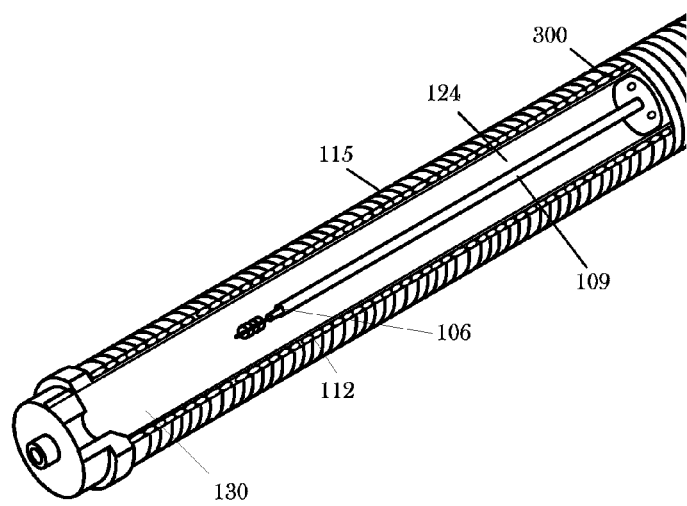
FIG. 3

GYROMAGNETIC PRECESSION OSCILLATOR

The earlier effective filing date of U.S. Provisional Application Ser. No. 60/957,574, filed Aug. 23, 2007, in the name of the inventor Michael C. Scott, et al., and entitled "Gyromagnetic Precession Oscillator", is hereby claimed under 35 U.S.C. §119. This application is also hereby incorporated by reference for all purposes as if set forth verbatim herein.

BACKGROUND OF THE INVENTION

1. Field of the Invention

The present invention is directed to a radio frequency source.

2. Description of the Related Art

There are commercial examples of devices that use the gyromagnetic principle. They utilize spheres of special ferrite material. The spheres are very small and the devices, called Yittrium Iron Garnett (YIG) oscillators, are limited in power output up to a few tens of watts. There are other tunable microwave frequency sources that are based on ferrite materials called Non Linear Transmission Lines ("NLTLs"). NLTLs use a different physical mechanism to produce the microwave radiation. While an NLTL has similar frequency agility, they can not produce frequencies above 2.0 GHz. This is a fundamental limitation of the materials and designs used in NLTLs.

The present invention is directed to resolving, or at least reducing, one or all of the problems mentioned above.

SUMMARY OF THE INVENTION

The present invention is, in one aspect, a radio frequency source, comprising a gyromagnetic precession oscillator. In a second aspect, the gyromagnetic precession oscillator comprises a closed, non-magnetic, cylindrical outer conductor defining a cavity therein; an axial field solenoid wound about the outer conductor; a non-magnetic, cylindrical inner conductor disposed within the cavity and coaxially aligned with the outer conductor; a plurality of cylindrical ferrite precessors, each defining a respective bore through which the inner conductor runs; a plurality of dividers disposed within and defining a resonant chamber in the cavity; and a dielectric material filling the cavity. In a third aspect, the radio frequency source is actively tunable. In a fourth aspect, the radio frequency source is tunable pulse-to-pulse.

BRIEF DESCRIPTION OF THE DRAWINGS

The invention may be understood by reference to the following description taken in conjunction with the accompanying drawings, in which like reference numerals identify like elements, and in which:

FIG. 2A-FIG. 2B depict two alternative ferrite precessor spacings for use in alternative embodiments; and FIG. 3 is partially sectioned depiction of a second particular embodiment of the present invention.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 1A:
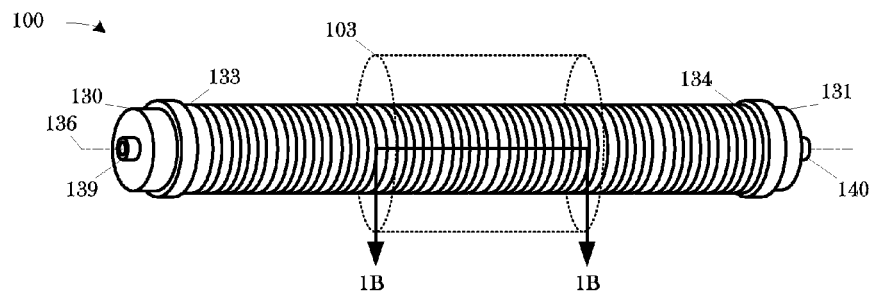
FIG. 1A-FIG. 1D illustrate one particular embodiment of the present invention.
Figure 1B:
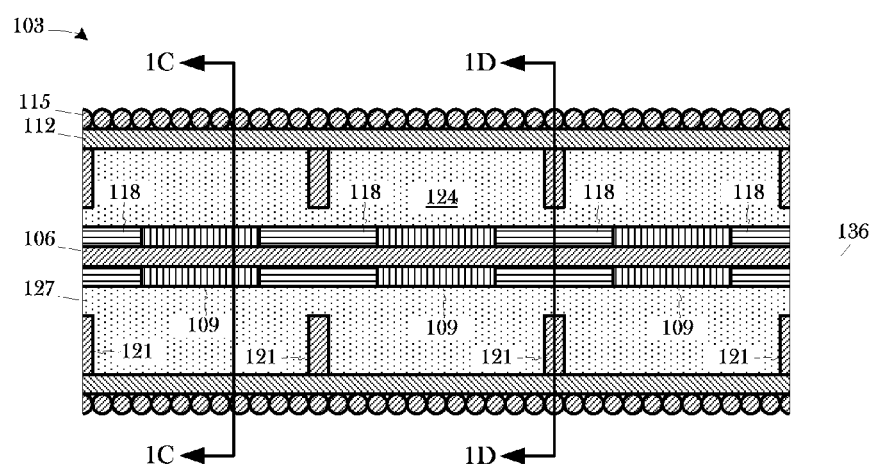

FIG. 1A-FIG. 1B illustrate one particular embodiment of a radio frequency signal source 100. FIG. 1A is an elevational, perspective view of one particular embodiment of the present invention. FIG. 1B is a cross-sectional view of a section 103 of the source 100 in FIG. 1A taken along line 1B-1B in FIG. 1A.

The source 100 is a new class of RF source called a Gyromagnetic Precession Oscillator ("GPO"). More particularly, a Gyromagnetic Precession Oscillators ("GPO") is a solid state device, which uses the gyromagnetic properties of ferrites to convert an input video pulse into RF energy. By controlling the input pulse and magnetic field bias parameters, the RF energy can be tailored over a range of center frequencies and instantaneous bandwidths. The center frequency of a GPO is tunable by ~10%, based on the input video pulse and applied bias.

Referring now to both FIG. 1A and FIG. 1B, the source 100 comprises an inner conductor 106 on which are mounted ferrite precessors 109 positioned within an outer conductor 112 about which an axial field solenoid 115 is wound. In the illustrated embodiment the ferrite precessors 109 are spaced apart by dielectric spacers 118, although these may be omitted in some embodiments. A plurality of dividers 121, in conjunction with the outer conductor 112, the ferrite precessors 109, and the dielectric spacers 118 define a resonant chamber 124. The dividers 121 are press fit into position which, if insufficient to keep them positioned, may be augmented by additional circular dielectric spacers (e.g., spacers 300, FIG. 3) in a manner analogous to the use of the dielectric spacers 118. The resonant chamber 124 is filled with a dielectric material 127.

The dielectric material 127 is contained within the resonant chamber 124 by a pair of endcaps 130, 131 threadably engaged with the outer conductor 112 at the ends 133, 134 thereof. Note that the manner in which the resonant chamber 124 is enclosed is not material to the practice of the invention. The endcaps 130, 131 need not be threadably engaged and alternative to the endcaps 130, 131 may be used in alternative embodiments may be used. Furthermore, the dielectric material 127 is, in the illustrated embodiment, a fluid, and, more particularly, a liquid. The threaded engagement between the endcaps 130, 131 is therefore suitably sealed using conventional techniques (e.g., O-rings, fluid tight threads, etc., not shown) to prevent its escape. These techniques may not be needed in embodiments in which the dielectric material 127 is not fluid. The endcap 130 includes fittings 139 to receive an input and the endcap 131 includes fittings 140 for outputting an RF signal.

Figure 1C:
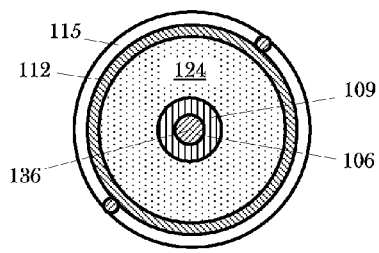
Figure 1D:
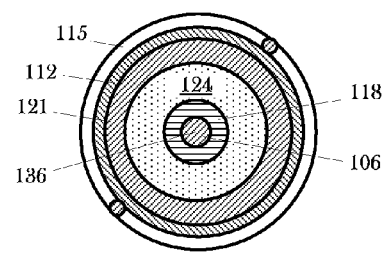

As can be seen from FIG. 1C and FIG. 1D, each of the inner conductor 106, ferrite precessors 109, outer conductor 112, axial field solenoid 115, dielectric spacers 118, and dividers 121 has a circular cross-section. FIG. 1C and FIG. 1D are cross-sections of the source 100 taken along line 1C-1C and line 1D-1D, respectively, of FIG. 1B. Each of these components is co-axially aligned with the central axis 136 of the source 100.

The inner conductor 106, outer conductor 112, and dividers 121 are fabricated from a non-magnetic, high conductivity material. Currently, certain metals are the only known materials that meet these requirements, but should other materials meeting these criteria become known they can also be used. More particularly, the inner conductor 106, outer conductor 112, and dividers 121 are fabricated from brass, aluminum, and aluminum, respectively. These components may also all be manufactured from the same material if desirable. For example, in one alternative embodiment, the inner conductor 106 is also made from aluminum like the outer conductor 112 and dividers 121. Note that structural strength for outer conductor 112 is a consideration in this particular embodiment since it must support the threaded engagement with the endcaps 130, 131. The outer conductor 112 also encases the fluid dielectric material 127.

The dielectric material 127 is, in the illustrated embodiment, a dielectric oil. A number of factors militated for this choice in this particular embodiment. The dielectric constant of the oil provided sufficient capacitance in the resonant chamber 124 to produce the desired output frequency. Also, the liquid nature of the oil helped facilitate the construction process—i.e., it was easy to pour into the resonant chamber 124. However, other dielectric materials, including materials in other states, may be desirable in alternative embodiments.

The ferrite precessors 109 are cylindrical ferrite beads and may be fabricated from practically any ferrite material. Note, however, that the material selection will influence the frequency of the output signal. In the illustrated embodiment, the ferrite precessors 109 are fabricated from Nickel-Zinc (NiZn). Other suitable ferrite materials include Manganese Magnesium (MnMg) and Yittrium Iron Garnett (YIG).

The ferrite precessors 109 are saturated with an axial, external DC bias magnetic field of approximately 25-50 kA/m. Subsequently they are remagnetized in a circumferential direction with a high voltage fast rising pulse of approximately 50 kV/ns launched down the coaxial waveguide assembly. This fast shock causes the magnetic dipoles in the material to precess creating a transverse electromagnetic wave in the coaxial waveguide at an RF frequency dependent on material properties, initial axial bias field, and the high voltage level of the shock pulse.

FIG. 1B shows the ferrite precessors 109 evenly spaced along the length of the inner conductor 106 by the dielectric spacers 118. The dielectric spacers 118 are used to maintain the positions of the ferrite precessors 109 on the inner conductor and within the resonant chamber 124. As mentioned above, and as is shown in FIG. 2A, the dielectric spacers 118 may be omitted in some embodiments. Note that the ferrite precessors 109 abut against each other end-to-end. Alternatively, the dielectric spacers 118 may be used to unevenly, but regularly, space the ferrite precessors 109 along the inner conductor 106 as is shown in FIG. 2B.

The spacing of the ferrite precessors 109 is a factor in the frequency of the output of the source 100. So are the length, outer dimension, and inner dimension of the ferrite precessors 109. Other factors influencing the output frequency include the spacing of the dividers 121, the inner diameter of the outer conductor 112, the diameter of the inner conductor 106, the magnitude of the axial magnetic field, the magnitude of the applied line voltage, and the material characteristics of the dielectric material 127.

The source 100 is rapidly and actively tunable and may be tunable pulse-to-pulse. More particularly, the source 100 may be actively tuned by varying or adjusting the axial magnetic field bias. This may be performed on a pulse to pulse basis with the proper external power supplies (not shown).

This invention fills the need for a high power, short pulse, rapidly tunable, microwave frequency source. The source is actively tunable and is tunable pulse-to-pulse. It has the capability for megawatt power levels of a few nanoseconds of duration in a tunable range from 2 to 3 gigahertz. This solution allows the rapid excitation of many ferrite cylindrical bodies in a coaxial waveguide assembly such that the combined output oscillations yield high output powers. The output power can be scaled according to the amount of ferrite material excited. The Gyromagnetic Precession Oscillator has a tunable frequency, is capable of higher frequencies than an NLTL, and can produce more power than a YIG Oscillator.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A radio frequency source, comprising:
    a closed, non-magnetic, cylindrical outer conductor defining a cavity therein;
    an axial field solenoid wound about the outer conductor;
    a non-magnetic, cylindrical inner conductor disposed within the cavity and coaxially aligned with the outer conductor;
    a plurality of cylindrical ferrite precessors, each defining a respective bore through which the inner conductor runs;
    a plurality of dividers disposed within and defining a resonant chamber in the cavity; and
    a dielectric material filling the cavity.

2. The radio frequency source of claim 1, further comprising means for spacing the cylindrical ferrite precessors on the inner conductor.

3. The radio frequency source of claim 2, wherein the spacing means includes a plurality of dielectric spacers, each defining a respective bore through which the inner conductor runs, coaligned with and spacing apart the cylindrical ferrite precessors on the inner conductor.

4. The radio frequency source of claim 1, wherein the dielectric material comprises a fluid.

5. The radio frequency source of claim 1, further comprising a pair of endcaps closing the cylindrical outer conductor.

6. The radio frequency source of claim 1, wherein the radio frequency source is actively tunable.

7. The radio frequency source of claim 6, wherein the radio frequency source is actively tunable pulse-to-pulse.

8. The radio frequency source of claim 6, wherein the radio frequency source is tunable pulse-to-pulse.

9. An actively tunable radio frequency source comprising:
    a closed, non-magnetic, cylindrical outer conductor defining a cavity therein;
    an axial field solenoid wound about the outer conductor;
    a non-magnetic, cylindrical inner conductor disposed within the cavity and coaxially aligned with the outer conductor;
    a plurality of cylindrical ferrite precessors, each defining a respective bore through which the inner conductor runs;
    a plurality of dividers disposed within and defining a resonant chamber in the cavity; and
    a dielectric material filling the cavity.

10. The radio frequency source of claim 9, wherein the radio frequency source is tunable pulse-to-pulse.

11. A radio frequency source that is tunable pulse-to-pulse, comprising:
- a closed, non-magnetic, cylindrical outer conductor defining a cavity therein;
- an axial field solenoid wound about the outer conductor;
- a non-magnetic, cylindrical inner conductor disposed within the cavity and coaxially aligned with the outer conductor;
- a plurality of cylindrical ferrite precessors, each defining a respective bore through which the inner conductor runs;
- a plurality of dividers disposed within and defining a resonant chamber in the cavity; and
- a dielectric material filling the cavity.

12. The radio frequency source of claim 11, wherein the radio frequency source is actively tunable pulse-to-pulse.

* * * * *